(12) United States Patent
Fukui

(10) Patent No.: US 10,115,655 B2
(45) Date of Patent: Oct. 30, 2018

(54) HEAT DISSIPATION SUBSTRATE AND METHOD FOR PRODUCING HEAT DISSIPATION SUBSTRATE

(71) Applicant: SUPERUFO291 TEC, Kyoto-shi, Kyoto (JP)

(72) Inventor: Akira Fukui, Kyoto (JP)

(73) Assignee: SUPERUFO291 TEC, Kyoto (JP)

( * ) Notice: Subject to any disclaimer, the term of this patent is extended or adjusted under 35 U.S.C. 154(b) by 0 days.

(21) Appl. No.: 15/109,486

(22) PCT Filed: Oct. 8, 2015

(86) PCT No.: PCT/JP2015/078685
§ 371 (c)(1),
(2) Date: Jul. 1, 2016

(87) PCT Pub. No.: WO2016/056637
PCT Pub. Date: Apr. 14, 2016

(65) Prior Publication Data
US 2016/0336253 A1 Nov. 17, 2016

(30) Foreign Application Priority Data
Oct. 9, 2014 (JP) .................................. 2014-207809

(51) Int. Cl.
*B22F 7/00* (2006.01)
*H01L 23/373* (2006.01)
(Continued)

(52) U.S. Cl.
CPC .......... *H01L 23/3732* (2013.01); *B22F 3/105* (2013.01); *B22F 3/1035* (2013.01);
(Continued)

(58) Field of Classification Search
None
See application file for complete search history.

(56) References Cited

U.S. PATENT DOCUMENTS 5,008,737 A * 4/1991 Burnham ................ C22C 26/00
165/905
6,987,318 B2 * 1/2006 Sung ..................... H01L 23/373
257/720
(Continued)

FOREIGN PATENT DOCUMENTS

CN 101390210 A 3/2009
CN 102149655 A 8/2011
(Continued)

OTHER PUBLICATIONS

"Density of Molten Elements and Representative Salts," in CRC Handbook of Chemistry and Physics, 97th Edition (Internet Version 2017), W. M. Haynes, ed., CRC Press/Taylor & Francis, Boca Raton, FL.*
(Continued)

*Primary Examiner* — Seth Dumbris
(74) *Attorney, Agent, or Firm* — Oliff PLC

(57) ABSTRACT

A heat dissipation substrate having a metallic layer with few defects on its surface is obtained by a process including the steps of: forming a metallic layer by plating on the surface of an alloy composite mainly composed of a powder of a principal metal, additional metal and diamond; and heating and pressurizing alloy composite coated with metallic layer, at a temperature equal to or lower than melting points of the metallic layer and the alloy composite. Consequently a heat dissipation substrate is obtained which has a coefficient of linear expansion of 6.5 ppm/K or higher and 15 ppm/K or lower as well as a degree of thermal conductivity of 420 W/m·K or higher, the substrate having a metallic layer with few defects in its surface layer and thereby allowing for a Ni-based plating on which the void percentage in the solder joint will be 5% or lower.

21 Claims, 1 Drawing Sheet

(51) Int. Cl.

| | |
|---|---|
| C25D 5/50 | (2006.01) |
| C22C 26/00 | (2006.01) |
| C23C 18/16 | (2006.01) |
| B22F 3/16 | (2006.01) |
| B22F 3/24 | (2006.01) |
| B22F 7/04 | (2006.01) |
| B23K 1/00 | (2006.01) |
| C23C 18/32 | (2006.01) |
| C25D 3/12 | (2006.01) |
| C25D 5/34 | (2006.01) |
| C25D 5/44 | (2006.01) |
| C25D 7/12 | (2006.01) |
| H01L 21/48 | (2006.01) |
| C25D 5/12 | (2006.01) |
| B22F 3/10 | (2006.01) |
| B22F 3/105 | (2006.01) |
| B22F 3/14 | (2006.01) |

(52) U.S. Cl.
CPC .................. *B22F 3/16* (2013.01); *B22F 3/24* (2013.01); *B22F 7/008* (2013.01); *B22F 7/04* (2013.01); *B23K 1/0016* (2013.01); *C22C 26/00* (2013.01); *C23C 18/16* (2013.01); *C23C 18/32* (2013.01); *C25D 3/12* (2013.01); *C25D 5/12* (2013.01); *C25D 5/34* (2013.01); *C25D 5/44* (2013.01); *C25D 5/50* (2013.01); *C25D 7/12* (2013.01); *H01L 21/4882* (2013.01); *H01L 23/373* (2013.01); *B22F 3/14* (2013.01); *B22F 2003/247* (2013.01); *B22F 2007/042* (2013.01); *B22F 2301/052* (2013.01); *B22F 2301/255* (2013.01); *B22F 2302/406* (2013.01); *B22F 2998/10* (2013.01); *B22F 2999/00* (2013.01); *H01L 2924/0002* (2013.01)

(56) References Cited

U.S. PATENT DOCUMENTS

| | | | |
|---|---|---|---|
| 8,178,893 B2 | 5/2012 | Takashima et al. | |
| 2004/0119161 A1* | 6/2004 | Saito | H01L 23/3732 257/729 |
| 2005/0051891 A1 | 3/2005 | Yoshida et al. | |
| 2005/0189647 A1* | 9/2005 | Sung | H01L 23/373 257/720 |
| 2006/0130998 A1* | 6/2006 | Ludtke | C04B 35/52 165/42 |
| 2008/0298024 A1 | 12/2008 | Takashima et al. | |
| 2009/0057705 A1* | 3/2009 | Takashima | H01L 23/14 257/99 |
| 2011/0198771 A1* | 8/2011 | Hirotsuru | B22D 19/00 264/45.3 |
| 2011/0256419 A1 | 10/2011 | Iwayama et al. | |
| 2014/0321060 A1* | 10/2014 | Ishii | B22F 3/105 361/704 |

FOREIGN PATENT DOCUMENTS

| | | | | |
|---|---|---|---|---|
| EP | 1452614 A1 | 9/2004 | | |
| EP | 1976004 A1 | 10/2008 | | |
| EP | 3 190 198 A1 | 7/2017 | | |
| JP | H06-13494 A | 1/1994 | | |
| JP | 10223812 | * 8/1998 | ........... | H01L 23/373 |
| JP | H10-223812 A | 8/1998 | | |
| JP | H10-231175 A | 9/1998 | | |
| JP | H11-67991 A | 3/1999 | | |
| JP | 2000-303126 A | 10/2000 | | |
| JP | 2002-206170 A | 7/2002 | | |
| JP | 2004-055577 A | 2/2004 | | |
| JP | 2004-175626 A | 6/2004 | | |
| JP | 2004-197153 A † | 7/2004 | | |
| JP | 2005-175006 A | 6/2005 | | |
| JP | 2006-505951 A | 2/2006 | | |
| JP | 2008-112893 A | 5/2008 | | |
| JP | 2008-248324 A | 10/2008 | | |
| JP | 4251986 B2 | 4/2009 | | |
| JP | 2009-218541 A | 9/2009 | | |
| JP | 2010-106362 A † | 5/2010 | | |
| JP | 2012-254891 A | 12/2012 | | |
| JP | 2013-098491 A † | 5/2013 | | |
| JP | 5350553 B1 | 11/2013 | | |
| JP | 2014-107468 A | 6/2014 | | |
| WO | 03/040420 A1 | 5/2003 | | |
| WO | 2004/044950 A2 | 5/2004 | | |
| WO | 2007/074720 A1 | 7/2007 | | |
| WO | 2009/098865 A1 | 8/2009 | | |
| WO | 2010/007974 A1 | 1/2010 | | |
| WO | 2016/035795 A1 † | 3/2016 | | |

OTHER PUBLICATIONS

Jan. 12, 2016 International Search Report issued in International Patent Application No. PCT/JP2015/078685.

Jan. 12, 2016 Written Opinion issued in International Patent Application No. PCT/JP2015/078685.

T. Schubert et al. "Interfacial Design of Cu-Based Composites Prepared by Powder Metallurgy for Heat Sink Applications". Materials Science and Engineering A, Elsevier B.V., Feb. 25, 2008, vol. 475, issue 1-2, pp. 39-44.

Feb. 10, 2015 Office Action issued in Japanese Patent Application No. 2014-207809.

Jun. 2, 2015 Office Action issued in Japanese Patent Application No. 2014-207809.

Aug. 17, 2016 Decision on Patent Opposition issued in Japanese Patent Application No. 2014-207809.

Oct. 20, 2017 Office Action issued in Chinese Patent Application No. 201580054759.0.

Sep. 22, 2017 Extended Search Report issued in European Patent Application No. 15848453.5.

Nov. 3, 2017 Observations submitted in European Patent Application No. 15848453.5.

\* cited by examiner
† cited by third party

HEAT DISSIPATION SUBSTRATE AND METHOD FOR PRODUCING HEAT DISSIPATION SUBSTRATE

TECHNICAL FIELD

The present invention relates to an inexpensive metal-diamond-system heat dissipation substrate to be installed in the package of a high-performance semiconductor module, the substrate having a metallic layer with few defects on its surface as well as having a suitable coefficient of linear expansion for semiconductor modules and a high degree of thermal conductivity. The present invention also relates to a method for producing such a substrate.

BACKGROUND ART

Semiconductor modules have various applications, such as the LSI, IGBT, power semiconductor, radio-wave/optical communication semiconductor, laser, LED and sensor. Their structures significantly vary depending on the required performances for these applications. A semiconductor module is an extremely sophisticated precision device composed of a plurality of members made of various materials having different coefficients of linear expansion along with different degrees of thermal conductivity. The heat dissipation substrate used in the package of the semiconductor module also has a wide variety of composite materials and shapes proposed thus far.

The heat dissipation substrate for semiconductor modules must have a suitable coefficient of linear expansion to secure the performance and life of semiconductor devices in the process of manufacturing the package and soldering the semiconductor devices. It also needs to have a high degree of thermal conductivity in order to dissipate heat from the semiconductor devices and cool them to secure their performance and life. It is also extremely important that the substrate should allow a satisfactory plating for the bonding of various members and semiconductor devices.

Heat dissipation substrates can be roughly classified by their forms as follows: a sub-mount of a few millimeters square with a thickness of 1 mm or less; a flat plate; a threaded flat plate; and a three-dimensional shape. A manufacturing method by which those shapes can be easily obtained is desired.

Originally, copper (Cu) was used for heat dissipation substrates. However, due to the recent improvement in the performance of the semiconductor modules, the amount of heat generation has increased so much that the use of Cu has caused problems in relation to the manufacturing process and durability of the package as well as the operation life of the semiconductor devices, since the coefficient of linear expansion of Cu is too large. Thus, there has been an increasing demand for a heat dissipation substrate having a coefficient of linear expansion that matches with high-performance semiconductor modules.

To address this problem, CuW and CuMo have been developed (Patent Literature 1), whose coefficient of linear expansion can be modified or adjusted so as to match with the coefficient of linear expansion for high-performance semiconductor modules. AlSiC has also been developed (Patent Literature 2) for applications which require lightweight materials. However, all of these composite materials have the problem that their thermal conductivity does not exceed 320 W/m·K and is lower than that of Cu when they have suitable coefficients of linear expansion for semiconductor modules.

Accordingly, various composite materials for heat dissipation substrates have been researched and developed, with the aim of creating a material whose coefficient of linear expansion is within the range covered by CuW, CuMo and AlSiC (6.5 ppm/K or higher and 15 ppm/K or lower) and one whose thermal conductivity is equal to that of Cu (393 W/m·K) or even higher and exceeds that of Ag (420 W/m·K) which has the highest thermal conductivity among metallic elements.

In addition to the coefficient of linear expansion and thermal conductivity, there is another important property for heat dissipation substrates: the quality of plating. When a manufacturer of semiconductor modules solders a semiconductor device or insulating sheet, if there are many voids at the bonded interface, those voids will block the flow of heat, causing separation of or damage to the semiconductor device or insulating sheet. Therefore, heat dissipation substrates need to have a surface layer which has few defects and thereby allows for the Ni-based final plating which enables a satisfactory soldering.

The Ni-based final plating is performed in various forms for securing its quality. To deal with those forms, the plating in some cases is performed by the manufacturer of the heat dissipation substrate or in the other cases by the package manufacturer. A variety of Ni-based plating methods, soldering materials, soldering conditions, etc. have been developed to meet the quality requirements. In order to secure the quality of the Ni-based final plating in these developing activities, it is extremely important that the heat dissipation substrate should have few defects in its surface layer. To achieve this, various types of heat dissipation substrates have been developed.

Since the Ni-based final plating can be performed in various forms, the values of the coefficient of linear expansion and thermal conductivity measured before the Ni-based final plating are generally used as the reference properties of a heat dissipation substrate made of a composite material.

Heat dissipation substrates made of Cu have few defects in their surface layer, so it is easy to have a satisfactory Ni-based final plating formed on it. However, in the case of machine-worked or polished products made of CuW or CuMo, the problem of the defects in the surface layer easily occurs if the relative density of the product is low; it is commonly said that, for practical purposes, the relative density should be equal to or higher than 99% of the true density. By contrast, in the case of clad products (metal-coated products), the problem related to the final Ni-plating is avoided, since the surface layers formed on the upper and lower surfaces of the product are Cu layers.

As for AlSiC, there is the problem that the plating cannot be easily formed on ceramic sites (SiC) even if the relative density is equal to or higher than 99% of the true density. However, even when the composite material has pinholes (micro-sized holes present on its surface) or similar defects or has SiC sites which obstruct the plating, the Ni-based final plating can be satisfactorily performed if pure aluminum foil or a layer of aluminum made by infiltration is provided on the surface of the composite material in the process of creating this material.

In recent years, due to the rapid progress and performance improvement of semiconductor modules, the amount of heat generated from the semiconductor devices is increasing, with the corresponding increase in the importance of the heat-control measure. Thus, there has been a strong demand for a novel, high-quality heat dissipation substrate which has: a coefficient of linear expansion which can match with that of the semiconductor modules; a high degree of thermal conductivity; and a surface condition which enables a satisfactory soldering that can pass the void assessment test at the bonded interface which is stricter than the solder wettability test.

Heat dissipation substrates made of metal-diamond composites have the possibility of achieving a high degree of thermal conductivity and are promising as a heat dissipation substrate for high-performance semiconductor modules. Therefore, various efforts for research and development have been made and reported thus far on this subject.

In the case of using only metal and diamond, the wettability of the metal to the diamond is so poor that it is difficult to produce a composite material for heat dissipation substrates by the liquid metal infiltration method or sintering method which are conventionally employed for the production of CuW or CuMo. Meanwhile, it has been reported that a high degree of thermal conductivity can be achieved by an ultrahigh pressure sintering method (Patent Literature 3) in which a powder of Cu and diamond is canned and sintered at high temperatures under a high pressure of 50000 atm. By this method, a composite material having a high relative density can be obtained. However, due to its diamond-rich composition, its coefficient of linear expansion is too low, and its production cost is high. Additionally, the process of slicing and grinding a block material is necessary to shape the material into the form of a product. Such a process creates defects, which cause a problem related to the quality of the Ni-based final plating and consequently limit the field of application.

It has been reported that a product obtained by sintering a green compact made of a powder mixture of a principal metal, additional metal and diamond has a high degree of thermal conductivity due to the carbide of the additional metal formed on the surface of the diamond (Patent Literature 4). However, an alloy composite obtained by this sintering method is unstable and cannot have a high real density. Consequently, a large number of pinholes are formed on the surface of the alloy composite, making it impossible to secure a satisfactory quality of the Ni-based final plating. Therefore, no alloy composite which can be used as the heat dissipation substrate has yet been obtained.

It has been reported that a high degree of thermal conductivity can be achieved by a manufacturing method in which a metal is infiltrated in a skeleton composed of diamond powder with the film of the carbide of additional metal formed on its surface layer (Patent Literature 5). This method can achieve a higher real density and higher thermal conductivity than the sintering method. However, the obtained products vary in composition due to the unstable structure of the skeleton. Additionally, the infiltrated metal remaining at the periphery needs to be removed using a diamond grinding wheel. This grinding process causes the chipping or grain separation of diamond from the surface of the composite; in particular, the interface separation between the diamond and metal occurs. Accordingly, it is impossible to perform the Ni-based final plating with the necessary level of quality for heat dissipation substrates even if a metal is deposited. Therefore, the obtained composite cannot be used as a heat dissipation substrate.

It has been reported that a high degree of thermal conductivity can be obtained by sintering a green compact of Cu-plated diamond powder by a spark plasma sintering (SPS) process (Patent Literature 6). However, the Cu-plating of the diamond powder is very expensive. Additionally, to achieve a high degree of thermal conductivity by the SPS electrical sintering method, the sintering process must be continued for a considerable period of time, which lowers productivity. Another problem is that the diamond is occasionally exposed on the surface layer, making it impossible to secure the necessary level of quality of the Ni-based final plating for a satisfactory soldering.

It has also been reported that a product obtained by pressure infiltration of Al—Si—Mg alloy into a skeleton composed of diamond powder coated with SiC ceramic (Patent Literature 7) has a high degree of thermal conductivity and yet can satisfy the quality requirement for Ni-based final plating due to the effect of the film of the infiltrated metal formed on its surface layer. However, in the case of a thin heat dissipation substrate, the product is unsuitable as the heat dissipation substrate since a layer made of the infiltrated metal, which is a poor conductor of heat, is present on its surface layer. This method is also uneconomical since the process of forming a layer of the infiltrated metal on the surface layer using a precision jig is extremely difficult and prevents inexpensive production of the composite. Additionally, the film of the infiltrated metal is not always suitable for the Ni-based final plating. Furthermore, this method is only applicable to aluminum alloy, and the content of the aluminum alloy must be 60% or less to secure the required level of stability of the skeleton. Therefore, this technique is only available for limited forms of heat dissipation substrates used in limited applications.

There has also been a report on a package produced by silver-brazing a pure copper plate onto a composite created by infiltrating Cu into a green compact of diamond powder coated with metal or ceramic (Patent Literature 8). However, the process of coating the diamond powder with metal or ceramic is expensive. Additionally, this method is uneconomical since it has many production steps, including the removal of the infiltrated metal remaining at the periphery using a diamond grinding wheel, followed by the silver brazing of the copper plate. When the pure copper plate is silver-brazed onto the heat dissipation substrate made of the metal-diamond composite, the copper reacts with the silver-brazing material and turns into an alloy, forming a low-thermal-conductivity layer. Additionally, even when a thick copper plate is used, voids or other defects occur in the brazing portion. Due to these problems, no composite which can be used as a heat dissipation substrate has yet been produced on a commercial basis.

CITATION LIST

Patent Literature

Patent Literature 1: JP 6-13494 A
Patent Literature 2: JP 2004-55577 A
Patent Literature 3: WO 2003/040420 A
Patent Literature 4: JP 11-67991 A
Patent Literature 5: JP 10-223812 A
Patent Literature 6: JP 2008-248324 A
Patent Literature 7: WO 2010/007974 A
Patent Literature 8: JP 2006-505951 A

SUMMARY OF INVENTION

Technical Problem

With regards to the previously reported heat dissipation substrates made of metal-diamond-system alloy composites, it has been reported that the coefficient of linear expansion can be modified or adjusted by varying the percentages of the metal and diamond, and a heat dissipation substrate having a higher degree of thermal conductivity than Cu and Ag can be obtained by increasing the percentage of the diamond or by using a large-particle diamond powder.

However, in the metal-diamond-system heat dissipation substrate, even when the real density of the alloy composite is 99% or higher, the plating metal cannot adhere to the surface area where the diamond is exposed. Consequently, a defect occurs, which will ultimately form a hole of approximately the same size as the exposed diamond. This hole-forming defect is also copied in the Ni-based final plating and emerges on the surface layer. The hole-forming defect can be eliminated by grinding the surface with a diamond wheel and subsequently depositing a metal (e.g. Ti) to coat the diamond with the metal. However, due to the influence of the interface separation between the diamond and metal, pinholes of a few micrometers or smaller in size newly occur in the surface area of the metallic plating layer. This makes it impossible to secure the necessary level of quality of the Ni-based final plating for a satisfactory soldering.

On the other hand, in the case of the alloy composite created by the liquid-phase sintering of a material mainly composed of a powder mixture of a principal metal, additional metal and diamond, the hole-forming defect will not occur since the exposed diamond is covered with a layer composed of the principal metal and the carbide of the additional metal. However, the carbide of the additional metal is inferior to Cu or other metals in terms of the ease of plating as well as the degree of adhesion. Therefore, internal voids are easily formed, and pinholes of a few micrometers or smaller in size are also easily formed in the surface layer. Furthermore, due to the poor level of sinterability, the relative density of the alloy composite tends to be low, and pinholes are also easily formed in the surface layer. Due to these factors, pinhole defects occur in the metallic plating layer, making it impossible to secure the quality of the Ni-based final plating.

Solution to Problem

To solve such problems, the heat dissipation substrate according to the present invention is produced by: forming a metallic layer, by plating, on the surface of an alloy composite created by various methods using a material mainly composed of a powder of metal and diamond; and heating and pressurizing the metallic layer at a temperature which is equal to or lower than the melting point of the metallic layer and equal to or lower than the melting point of the alloy composite, so as to obtain a metal-diamond-system heat dissipation substrate having a metallic layer with few defects in its surface layer as well as having a suitable coefficient of linear expansion for semiconductor modules and a high degree of thermal conductivity.

That is to say, the method for producing a heat dissipation substrate according to the present invention includes the steps of:
  performing a plating process on the surface of an alloy composite mainly composed of a powder of metal and diamond, to form a metallic layer; and
  mending a defect in the metallic layer by heating and pressurizing the alloy composite coated with the metallic layer, at a temperature which is equal to or lower than the melting point of the metallic layer and equal to or lower than the melting point of the alloy composite.

The term "alloy composite" in the previous description means a powdery mixture having a certain self-supporting shape. For example, the alloy composite according to the present invention can be obtained by compacting a mixed powder of metal and diamond in a mold. Preferably, the liquid-phase sintering should additionally be performed on the molded compact to create the alloy composite. Other methods, such as the infiltration method, may alternatively be used to create the alloy composite.

The phrase "equal to or lower than the melting point of the metallic layer and equal to or lower than the melting point of the alloy composite" means that the temperature is equal to or lower than either the melting point of the metallic layer or that of the alloy composite, whichever is the lower figure.

The condition that the heating and pressurizing process should be performed at a temperature which is not higher than the melting points of the metallic layer and the alloy composite (i.e. under the condition that both the metallic layer and the alloy composite are maintained in solid state) is common to the condition used in the solid-phase sintering. Accordingly, in the present description, the previously described heating and pressurizing process is conveniently called the "solid-phase sintering". However, it should be noted that the process in question is primarily aimed at mending a defect in the metallic layer; the internal restructuring of the alloy composite is not essential, although preferable.

More specifically, plating is performed on an alloy composite obtained by an appropriate method (e.g. by compacting a mixed powder of a principal metal, additional metal and diamond in a mold, and subsequently performing the liquid-phase sintering) to form a metallic layer on it, and subsequently, the heating and pressurizing process is performed under the previously described condition to obtain a heat dissipation substrate for semiconductor modules, the substrate having a metallic layer with few defects in its surface layer as well as having a coefficient of linear expansion within a range from 6.5 to 15 ppm/K and a degree of thermal conductivity of 420 W/m·K or higher.

In other words, in the method for producing a heat dissipation substrate according to the present invention, it is preferable to create the alloy composite mainly composed of a powder of a principal metal, an additional metal which is different from the principal metal, and diamond.

The principal metal may be at least one substance selected from the group of Ag, Cu, Al and alloys of these metals.

The additional metal may be at least one substance selected from the group of Ti, Cr, Co, Mn, Ni, Fe, B, Y, Si, Mg and Zn. The amount of addition should preferably be equal to or higher than 1 vol % and equal to or lower than 15 vol % of the entire amount of the alloy composite.

Sintering metallic powder is a method by which various kinds of products can be precisely manufactured at the lowest cost. It is most likely that small-to-middle-sized products can be thereby produced in a near-net shape. By this technique, various semiconductor parts have already been developed and practically used.

However, when the liquid-phase sintering process is performed on a mixture which only contains metal powder and diamond powder, it is in some cases impossible to obtain a correct alloy composite since the wettability of the metal to the diamond is so poor that the metal may be separated from the diamond in the sintering process or the metal may appear in a granular form on the surface layer.

When the alloy composite is obtained by the liquid-phase sintering of a mold-compacted mixed powder of a principal metal, additional metal and diamond, although in some cases it has a low relative density and is unstable, large defects barely occur in the metallic layer formed by plating, since the exposed diamond is covered with a layer composed of the principal metal and the carbide of the additional metal. However, the principal metal and the carbide of the additional metal are not always easy to be plated. Additionally, due to their poor level of sinterability, voids are easily formed at the interface between the alloy composite and the metallic layer. Due to these problems, it is impossible to secure the quality of the Ni-based final plating. Furthermore, the thicker the metallic plating layer is, the lower the degree of adhesion of this layer becomes, allowing many voids and other defects to occur inside. If the surface layer is composed of large grains, the surface layer may be uneven and the grains may be eventually detached.

With such a background, the present inventor has developed a method for performing the Ni-based final plating which enables a satisfactory soldering even on an alloy composite obtained by the liquid-phase sintering of a mold-compacted mixed powder of a principal metal, additional metal and diamond. According to the method, the alloy composite on which a metallic layer is formed by plating is heated and pressurized under the previously described condition, whereby the degree of adhesion of the metallic layer is increased, while the internal voids, pinholes, unevenness and other defects in the metallic layer are mended. The inventor has also found that heating and pressurizing the metallic layer can produce the additional effect of making the alloy composite denser and thereby improve and stabilize its properties.

In recent years, the quality of the heat dissipation substrates for high-performance modules has been checked by measuring the solder void percentage after a semiconductor device or insulating sheet is soldered on the heat dissipation substrate which has undergone the Ni-based final plating. Accordingly, the solder void percentage was measured. The result confirmed that, by forming a metallic layer with few defects in the surface layer, it becomes possible to secure the necessary level of quality of the Ni-based final plating for the heat dissipation substrate to enable a satisfactory soldering which conforms with strict standards.

The present invention also provides a heat dissipation substrate, which includes: an alloy composite mainly composed of a powder of a principal metal, an additional metal which is different from the principal metal, and diamond; and a metallic layer formed on the surface of the alloy composite,
wherein: the coefficient of linear expansion of the substrate is 6.5 ppm/K or higher and 15 ppm/K or lower; the degree of thermal conductivity of the substrate is 420 W/m·K or higher; and the percentage of the defects on the surface of the metallic layer is 5% or lower.

The "defects on the surface" are the so-called pinholes. The percentage of the area occupied by the pinholes can be assessed, for example, by the aforementioned solder void percentage.

The term "alloy composite" in the previous description has the same meaning as the "alloy composite" in the method for producing a heat dissipation substrate according to the present invention, i.e. a powdery mixture having a certain self-supporting shape. The alloy composite may be a mold-compacted mixed powder of a principal metal, additional metal, and diamond, although it is more preferable to additionally perform the liquid-phase sintering on this powder compact.

Advantageous Effects of the Invention

According to the present invention, an alloy composite which is mainly composed of a powder of a metal, diamond and additive is coated with a metallic layer by plating. The alloy composite is subsequently heated and pressurized in a non-oxidizing atmosphere (e.g. in vacuum) at a temperature which is not higher than the melting points of the metallic layer and the alloy composite. By this process, the pinholes on the surface of the metallic layer and the voids inside the same layer are mended. Consequently, a metallic layer with few defects is obtained. Thus, a heat dissipation substrate which can secure the necessary level of quality of the Ni-based final plating for a satisfactory soldering is obtained. It is also possible to make the alloy composite denser and improve its relative density as well as thermal conductivity.

It has been confirmed that the obtained product causes no serious problems in the quality of the Ni-based final plating and can be suitably used as the heat dissipation substrate if the following conditions are met: the metallic layer has few defects; the coefficient of linear expansion and the thermal conductivity satisfy the requirements for the heat dissipation substrate; and the relative density of the inner alloy composite is not extremely low, such as 90% or lower.

For a heat dissipation substrate which needs to be heat-resistant, Ag, Cu or their alloy can be used as the principal metal. For a heat dissipation substrate which needs to be lightweight, Al or its alloy can be used as the principal metal. In this manner, an alloy composite can be created which nearly covers the same range of coefficients of linear expansion as the heat dissipation substrates made of CuW, CuMo or AlSiC while enabling a satisfactory soldering as well as achieving a high degree of thermal conductivity.

With the method for producing a heat dissipation substrate according to the present invention, various forms of heat dissipation substrates can be processed, such as: a submount (a few millimeters square, with thickness of 0.1 mm to 1 mm); a flat plate (10 mm wide and 250 mm long, with a thickness of 0.8 mm to 5 mm); a threaded flat plate (10 mm wide and 250 mm long, with a thickness of 0.8 mm to 5 mm); flat plate; and a three-dimensional shape (10 mm to 50 mm across, with a thickness of 1 mm to 5 mm).

For a heat dissipation substrate which should satisfy a strict thickness requirement, grinding is necessary. As with the heat dissipation substrate which consists of a conventional metal-diamond alloy composite, the heat dissipation substrate according to the present invention is also accompanied by the problem that the grinding process using a diamond wheel may cause the chipping or grain separation of diamond from the surface of the alloy composite; in particular, an interface separation may occur between the metal layer and the diamond exposed on the surface of the alloy composite, making it impossible to form a satisfactory Ni-based final plating even if a metal is deposited. In the method for producing a heat dissipation substrate according to the present invention, this problem can be solved and a satisfactory Ni-based final plating can be assuredly formed by depositing a metal (e.g. Ti, Cr, Au or Pt) on the alloy composite, then forming the metallic layer by plating, and subsequently performing the heating and pressurizing process.

In some cases, it is necessary to produce a heat dissipation substrate having a high level of mechanical strength and a high degree of thermal conductivity without changing its composition. This can be achieved by creating an alloy composite by a liquid-phase sintering process (or otherwise), pressurizing the alloy composite at a high temperature immediately below its melting point, forming the metallic layer by plating, and heating and pressurizing the alloy composite coated with the metallic layer.

The heating and pressurizing process can be performed in various kinds of atmosphere, such as the vacuum, low-pressure, non-oxidizing, reducing or inert-gas atmosphere. However, this method needs a large system and requires a considerable amount of time for the sintering. Alternatively, the heating and pressurizing process may be performed under water, using a commercially available resistance welder. By this method, the heat dissipation substrate according to the present invention can be easily and inexpensively produced. This method does not require slicing, grinding, cutting or similar work. Accordingly, it is possible to obtain a heat dissipation substrate in a near-net shape and with a high degree of thermal conductivity by using large diamond particles.

The present invention is a technique in which existing techniques are applied so as to easily provide a metal-diamond-system alloy composite with a metallic layer which has few defects and thereby allows for a satisfactory soldering. In one mode of the present invention, the novel technique of performing the heating and pressurizing process under water is employed, whereby a heat dissipation substrate using an alloy composite of a metal, additive and diamond can be produced in a near-net shape. Furthermore, the relative density and thermal conductivity of the alloy composite can also be improved and stabilized by heating and pressuring the alloy composite after the plating process.

According to the present invention, a high-performance heat dissipation substrate using an alloy composite of a metal, additional metal and diamond can be produced in a near-net shape. Such a substrate cannot be produced if CuW, CuMo, AISiC or other materials is used.

As described earlier, in one mode of the present invention, a metallic layer is formed on an alloy composite created by performing a liquid-phase sintering process on a mold-compacted powder mixture of a principal metal, additional metal and diamond, and subsequently, the metallic layer is heated and pressurized. By such a two-stage process, a novel yet inexpensive heat dissipation substrate for semiconductor modules can be obtained, the substrate having a metallic layer with few defects in its surface layer, with the coefficient of linear expansion being 6.5 ppm/K or higher and 15 ppm/K or lower as well as the degree of thermal conductivity being 420 W/m·K or higher.

DESCRIPTION OF EMBODIMENTS

Composition

Figure 1:
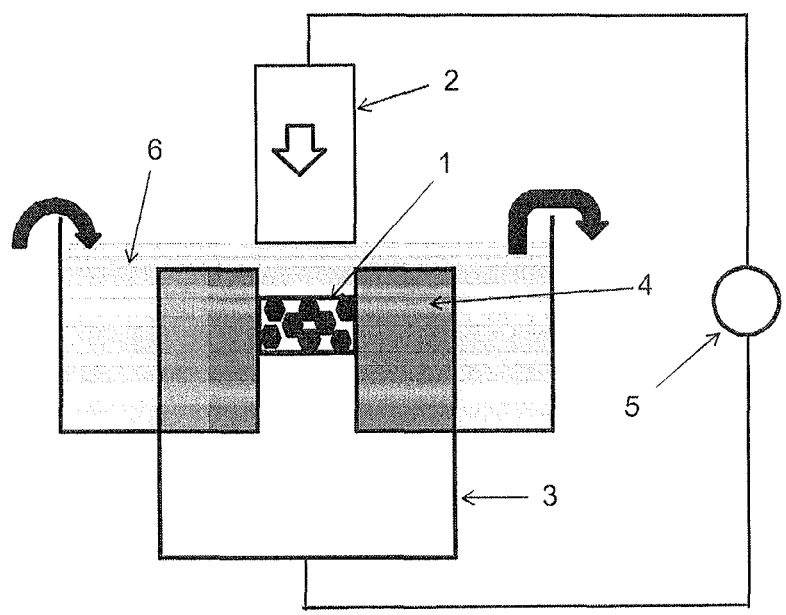
FIG. 1 is a schematic diagram of a system for performing a secondary process underwater.
Figure 2:
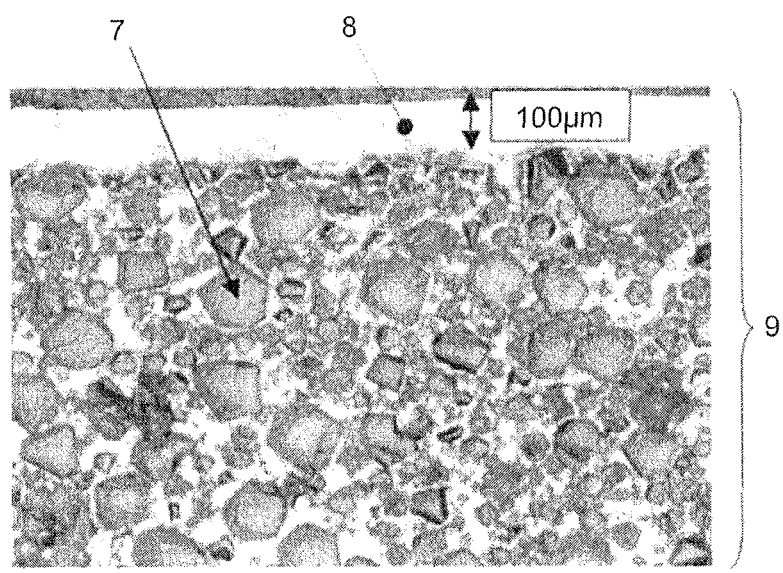
FIG. 2 is a photograph showing an enlarged view of a section of the heat dissipation substrate.

It has already been reported that, when the principal metal is Ag, Cu, Al or an alloy of any of these metals, a heat dissipation substrate having a coefficient of linear expansion of 6.5 ppm/K or higher and 15 ppm/K or lower as well as a degree of thermal conductivity of 420 W/m·K or higher can be produced by performing a liquid-phase sintering process on a mold-compacted body of a powder in which an additional metal and diamond are optimally mixed. However, this technique has not yet been used on a practical basis due to various problems. For example, despite the use of the additional metal, the sintered state is unstable and the relative density is low, making it impossible to secure the quality of the Ni-based final plating. Furthermore, the degree of thermal conductivity significantly varies and does not constantly achieve the level of 420 W/m·K or higher.

According to the present invention, a metallic layer is formed by plating on the surface of an alloy composite mainly composed of a powder of metal and diamond. The metallic layer is subsequently heated and pressurized at a temperature equal to or lower than the melting points of the metallic layer and the alloy composite (this heating and pressurizing process is hereinafter conveniently called the "solid-phase sintering"), so as to form a metallic layer with few defects in its surface layer and thereby improve and stabilize the thermal conductivity. The term "alloy composite" means an object shaped into a mass. For example, the alloy composite can be obtained by compacting a mixed powder of metal and diamond in a mold, although it is more preferable to additionally perform the liquid-phase sintering on the molded compact to create a high-density alloy composite. Other methods, such as the infiltration method, may alternatively be used to create the alloy composite.

For an application which requires heat resistance, Ag, Cu or their alloy should preferably be used as the principal metal. For a large-sized heat dissipation substrate which needs to be lightweight, Al or its alloy should preferably be used as the principal metal.

The additional metal may be any element which can form a carbide with diamond or can be combined with the principal metal to form an alloy. Examples include Ti, Cr, Co, Mn, Ni, Fe, B, Y, Si, Mg and Zn. The amount of addition should be equal to or higher than 1 vol % and equal to or lower than 15 vol % of the entire alloy composite. Two or more metals can be simultaneously added as long as they produce expected effects. If the amount of additional metal is lower than 1 vol % or higher than 15 vol %, the thermal conductivity cannot be 420 W/m·K or higher.

When the principal metal is a substance selected from the group of Ag, Cu and their alloys, the following metals can be used as the additional metal: Ti, Cr, Co, Mn, Ni, Fe and B. The amount of addition should preferably be equal to or higher than 1 vol % and equal to or lower than 5 vol % of the entire alloy composite. If the amount of addition is lower than 1 vol % or higher than 5 vol %, the thermal conductivity cannot be 420 W/m·K or higher. When the principal metal is Al or its alloy, Si can be used as the additional metal. The amount of addition should preferably be equal to or higher than 5 vol % and equal to or lower than 15 vol % of the entire alloy composite. If the amount of addition is lower than 5 vol % or higher than 15 vol %, the thermal conductivity cannot be 420 W/m·K or higher. Adding 1.0 vol % of Mg produces the effect of stabilizing the liquid-phase sintering (which will be described later).

In order to secure a satisfactory value of thermal conductivity, 95% or more of the diamond powder should preferably have a particle size of 10 μm or larger and 1000 μm or smaller. If the particle size is not larger than 10 μm, the thermal conductivity cannot be 420 W/m·K or higher. If the particle size is not smaller than 1000 μm, the thermal conductivity will barely improve, and additionally, the cutting or other work will be extremely difficult. Furthermore, the powder price will be dramatically high. However, the diamond powder may contain a small amount of particles whose size is smaller or larger than the aforementioned range as long as 95% or more of the diamond powder falls within the aforementioned range of particle size. In other words, up to 5% of the particles of the diamond powder may have a particle size smaller than 10 μm or larger than 1000 μm.

In addition, since the diamond powder is expensive, a portion of the diamond powder may be replaced with a powder of an inexpensive material having a low coefficient of linear expansion, such as SiC, W or Wo, as long as the property requirements of the heat dissipation substrate according to the present invention are satisfied.

(Liquid-Phase Sintering)

The sintering process which is performed on the mold-compacted mixed powder of the principal metal, additional metal and diamond should preferably be a liquid-phase sintering process performed in a vacuum, low-pressure, high-pressure, non-oxidizing, reducing-gas, or inert-gas atmosphere at a temperature higher than the temperature at which the liquid phase of the principal metal emerges (melting point). The liquid-phase sintering causes the additional metal to react with the diamond and form a carbide on the surface layer of the diamond particle. Furthermore, the carbide, additional metal and principal metal react with each other and form an alloy layer. Consequently, an alloy composite mainly composed of the powder of metal, additive and diamond is obtained.

(Metallic Layer)

The metallic layer is a coating formed by plating on the liquid-phase-sintered alloy composite or on an object obtained by polishing the alloy composite. This layer should be made of Ag, Cu, Ni or an alloy of these metals, with a thickness of 5 µm or larger and 200 µm or smaller. Under these conditions, the metallic layer may cover the alloy composite in any form as follows: the entire surface, the upper and lower sides, or only areas on which semiconductor devices will be mounted. In particular, a metallic layer of Ag or Cu is preferable due to their softness and high degree of thermal conductivity. The plating of Ni or an alloy of these metals is effective for an aluminum-diamond-system heat dissipation substrate having a large area and large thickness. The metallic layer may have a multilayer structure formed by plating using Ag, Cu, Ni or an alloy of these metals.

If the metallic layer is not thicker than 5 µm, it is difficult to form the metallic layer with few defects necessary for the heat dissipation substrate over the entire area by the heating and pressurizing process. If the thickness is not smaller than 200 µm, the metallic layer is likely to be extremely unstable. Furthermore, the plating process will be expensive.

(Solid-Phase Sintering)

The solid-phase sintering process, which follows the plating process, can be performed in various kinds of ambience, such as vacuum, low-pressure, high-pressure, non-oxidizing, inert-gas, fire-resistant liquid, or non-combustible liquid. Performing the electrical sintering underwater is advantageous, since this method can create the product in a near-net shape and yet is inexpensive. By performing the heating and pressurizing process at a temperature equal to or lower than the melting points of the metallic layer and the alloy composite as well as at a pressure of 50 MPa or higher and 500 MPa or lower (i.e. under the conditions corresponding to the solid-phase sintering), it is possible to mend the defects in the metallic plating layer on the surface of the alloy composite, and additionally, to improve and stabilize the thermal conductivity of the alloy composite itself. Such a manufacturing process can be performed by hot-pressing, forging, electrical sintering or otherwise. By the solid-phase sintering process, the metallic layer made of Ag, Cu, Ni or an ally of these metals formed by plating on the surface of the alloy composite composed of metal and diamond can be made to have few defects as in the surface layer of the heat dissipation substrate made of Cu.

For the solid-phase sintering of thin sheets or wafers, hot-pressing is effective, since this method allows those articles to be produced in a stacked form. For the near-net shaping, electrical sintering is suitable. Furthermore, by applying heat and pressure, the thermal conductivity can be improved and stabilized. Since the plating made of Ag, Cu, Ni or an alloy of these metals softens at high temperatures, the sintering process should preferably be performed at a temperature equal to or higher than 400° C. and equal to or lower than the melting point of the metal as well as at a pressure of 50 MPa or higher and 500 MPa or lower. If the temperature is not higher than 400° C., it is difficult to sufficiently mend the defects. If the temperature is not lower than 600° C., large burrs begin to extrude from jigs or electrodes, causing a noticeable decrease in the life of the jigs. When Al or its alloy is used, 500° C. or lower temperatures are preferable since the melting point is low.

The pressure should preferably be set at 50 MPa or higher. Setting a lower pressure level makes it difficult to sufficiently mend the metallic layer. Setting the pressure at 500 MPa or higher is uneconomical since it requires a large pressurizing system. Furthermore, commonly used jigs and electrodes may be broken under such a high pressure level. Accordingly, it is essential to select the solid-phase sintering conditions (temperature and pressure), jigs and electrodes that are suitable for the kind of alloy composite and that of the metallic layer.

Solid-phase sintering in a vacuum, gas or similar atmosphere requires a large system and a long period of time for heating and pressurizing. Furthermore, this process is difficult to automatize. Underwater solid-phase sintering can similarly produce the effect of improving the metallic plating layer. Using a commercially available resistance welder, an alloy composite coated with a metallic layer is clamped between metallic electrodes underwater, and electric current is passed to sinter it. Such a solid-phase sintering process can be completed within tens of seconds, and can be automatized. The quality of the metallic plating layer can be additionally improved by repeatedly turning on and off the current passed through the alloy composite while holding it between the electrodes. This process is also capable of the neat-net-shape mass production of heat dissipation substrates in various forms for small parts, threaded flat plates, three-dimensional shapes, etc. Furthermore, this manufacturing method can achieve a high level of surface accuracy and does not require the grinding work using a diamond wheel or cutting work. The method allows the use of diamond powder having large particle sizes, so that a heat dissipation substrate having a high degree of thermal conductivity can be obtained.

During the solid-phase sintering process using heat and pressure, a portion of the metallic layer turns into burrs and makes this layer thinner. The thickness may further decrease due to the buffing work performed for improving the surface-roughness accuracy to achieve a desired surface roughness. However, no problem will arise if the eventually remaining metallic layer has a thickness of 2 µm or greater over the entire surface of the alloy composite.

(Working)

In the case of an alloy composite of a thin sheet or wafer, the surface roughness of the jigs or electrodes is copied onto its surface. Therefore, the product is obtained by cutting the alloy composite into a predetermined form by a water jet, high-power laser, wire cut or similar device. If an even higher level of accuracy is needed, the metallic layer can be polished into a predetermined surface roughness with abrasive paper or buff before the alloy composite is cut into the predetermined form by a water jet, high-power laser, wire cut or similar device to obtain the product. Manufacturing the alloy composite in a near-net shape is advantageous in terms of the processing cost since the technique does not require the shaping work.

(Final Plating)

The final plating is performed to allow the bonding of various members, insulating sheets, semiconductor devices or other elements on the heat dissipation substrate by silver-brazing, soft-soldering or otherwise. If there are defects on the heat dissipation substrate, the Ni-based final plating will also be defective due to their influences, so that the silver-brazing or soft-soldering cannot be performed with a satisfactory level of quality. Forming the Ni-based plating in layers would merely copy the defects in sequence and not solve the problem. It should be noted that the term "Ni-based plating" means a plating of Ni or its alloy.

The solder bonding of semiconductor devices on the heat dissipation substrate is the most important process for semiconductor modules. Accordingly, an extremely low level of void percentage is required. In recent years, various materials and techniques for soldering have been developed. Among those materials, SnAgCu (melting point, 218° C.) is popularly used to realize Pb-free production and to allow for high-temperature treatments. This material is also used for the assessment.

For the conventional heat dissipation substrate made of Cu, the plating is performed by an electrolytic Ni, electroless Ni—P or electroless Ni—B method. For a heat dissipation substrate made of CuW or CuMo system, the final plating is performed by a combination of two methods: electrolytic Ni and electroless Ni—P, electroless Ni—P and electroless Ni—B, or electroless Cu and electroless Ni—P. For AlSiC, the combination of electroless Ni—P and electroless Ni—B is used. In general, in order to secure a satisfactory level of solder quality, the void quality of the soldering is assessed under the condition that the final plating is a 3-μm-thick Ni—B plating.

In advance of the Ni-based final plating, a multilayer plating process may be performed, as in the case of CuW, CuMo or AlSiC. However, in the case of the heat dissipation substrate according to the present invention, only the Ni-based plating as the final surface layer needs to be formed since the metallic layer on the surface of the alloy composite serves as the first layer. Even the Ni-based final plating can be omitted in the case where the metallic plating layer is a Ni-based plating formed by electrolytic Ni, electroless Ni—P or electroless Ni—B plating.

The solder quality has often been assessed according to JIS Z3197 (which corresponds to ISO 94455), which requires that the solder have a spread area of 80% or higher. However, this standard is not strict enough to meet actual situations. Accordingly, a new standard has recently been used, which requires that the void area be 5% or lower.

If the final plating is a 3-μm-thick Ni—B plating, the assessment condition of the SnAgCu soldering (melting point, 218° C.) is extremely strict: it is commonly known that no problem related to the silver brazing, other kinds of soldering, resin adhesion or similar processes occurs if the void percentage determined by an ultrasonic measurement is 5% or lower. The voids which occur in the soldering process reflect the pinholes which exist on the surface of the heat dissipation substrate before the Ni-based final plating is performed. Therefore, it is possible to satisfy the assessment condition of the SnAgCu soldering (melting point, 218° C.) by using a heat dissipation substrate with a pinhole (defect) area ratio of 5% or lower on its surface. This assessment condition can also be used to determine whether or not the requirements of the heat dissipation substrate according to the present invention are satisfied.

<Assessment of Heat Dissipation Substrate>

(Measurement of Coefficient of Linear Expansion)

Test pieces measuring 10 mm in length, 5 mm in width, and 2-2.5 mm in thickness were cut out from a solid-phase-sintered sample (an alloy composite with a metallic layer formed on its surface) measuring 25 mm×25 mm×2-2.5 mm using a wire electric discharge machine (WEDM) and power laser. Their coefficient of linear expansion at room temperature (25° C.) was measured with a thermal expansion coefficient meter (manufactured by Seiko Instruments Inc.).

(Measurement of Thermal Conductivity)

Test pieces measuring 10 mm in diameter and 2-2.5 mm in thickness were cut out from a solid-phase-sintered sample (an alloy composite with a metallic layer formed on its surface) measuring 25 mm×25 mm×2-2.5 mm using a WEDM and power laser. Their degree of thermal conductivity at room temperature (25° C.) was measured with a laser-flash thermal conductivity meter (TC-7000, manufactured by Advance Riko, Inc.).

(Adhesion Test of Metallic Layer)

A solid-phase-sintered sample (an alloy composite with a metallic layer formed on its surface) measuring 25 mm×25 mm×2-2.5 mm was held in the air at 450° C. for 30 minutes. Its appearance was visually observed through a microscope with a magnification of 10 times. The sample was rated as "OK" (if the metallic plating layer had no blister) or "NG" (if there was a blister, regardless of its size).

(Measurement of Solder Void Quality)

A solid-phase-sintered sample (an alloy composite with a metallic layer formed on its surface) measuring 25 mm×25 mm was prepared. After the sample was deburred and buffed, a 3-μm-thick Ni—B plating was formed on its surface to obtain a heat dissipation substrate. A silicon device measuring 10 mm×10 mm×0.7 mm having metallic electrodes was bonded on the substrate with a high-temperature solder of SnAgCu (melting point, 218° C.). The void area was investigated by ultrasonic waves and rated as "OK" (if the void area was 5% or lower) or "NG" (if the void area was higher than 5%). This assessment is extremely strict: it is commonly known that no problem related to the silver brazing, other kinds of soldering, resin adhesion or similar processes occurs if the void percentage determined by this measurement is 5% or lower.

EXAMPLE

Example 1; Heat Dissipation Substrate Sample of Ag—Ti-Diamond, Sample No. 9

A mixed powder of Ag (69 vol %), Ti (1 vol %) and 30-μm diamond (30 vol %) was compacted in a 25-mm×25-mm mold at a pressure of 500 MPa by a pressing machine. Next, the liquid-phase sintering was performed in vacuum at 1100° C. for 60 minutes to obtain an alloy composite. After a 5-μm-thick metallic layer was formed on the alloy composite by an Ag-plating process, the solid-phase sintering was performed by hot-pressing under the condition that the alloy composite was held at 400° C. under 50 MPa for 30 minutes. After deburring, the blister test was performed. Subsequently, a 3-μm-thick Ni—B plating was formed, and the void quality of the soldering was assessed.

The result is shown in Table 1.

Example 2; Heat Dissipation Substrate Sample of Cu—Cr-Diamond, Sample No. 15

A mixed powder of Ag (35 vol %), Cr (5 vol %) and 100-μm diamond (60 vol %) was compacted in a 25-mm×25-mm mold at a pressure of 500 MPa by a pressing machine. Next, the liquid-phase sintering was performed in a hydrogen atmosphere at 1200° C. for 60 minutes to obtain an alloy composite. Subsequently, a 50-μm-thick metallic layer was formed on the alloy composite by a Cu-plating process. Then, with the alloy composite placed in a ceramic jig and pressurized at 300 MPa between the upper and lower electrodes of an electrical sintering device, the solid-phase sintering was performed under the condition that the alloy composite was heated at 600° C. for 5 minutes by passing electric current. After deburring, the blister test was performed. Subsequently, a 3-μm-thick Ni—B plating was formed, and the void quality of the soldering was assessed.

The result is shown in Table 1.

Example 3; Heat Dissipation Substrate of Ag—Ti-Diamond-Cu (bal.), Sample No. 24

A powder of Ag (10 vol %), Cu (37 vol %), Ti (3 vol %) and 100-μm diamond (30 vol %) was mixed with a powder of 30-μm diamond (20 vol %). The mixed powder was compacted in a 25-mm×25-mm mold at a pressure of 500 MPa by a pressing machine. Next, the liquid-phase sintering was performed in vacuum at 1000° C. for 60 minutes to obtain an alloy composite. Subsequently, a 100-μm-thick metallic layer was formed on the alloy composite by a Cu-plating process. Then, as shown in FIG. 1, with the plated alloy composite 1 placed in a ceramic jig 4 and pressurized at 100 MPa between the upper and lower substrates 2 and 3 of a resistance welder underwater 6, the solid-phase sintering was performed under the condition that the alloy composite was maintained at 500° C. for 2 seconds by continuously passing electric current. The current-passing operation for increasing the temperature to 500° C. was repeated three times while maintaining the pressure. After deburring, the blister test was performed. Subsequently, a 3-μm-thick Ni—B plating was formed, and the void quality of the soldering was assessed.

The result is shown in Table 1.

Example 4; Heat Dissipation Substrate Sample of Al—Si—Mg-Diamond, Sample No. 27

A powder of Al (29 vol %), Si (10 vol %), Mg (1 vol %) and 50-μm diamond (60 vol %) was compacted in a 25-mm×25-mm mold at a pressure of 500 MPa by a pressing machine. Next, the liquid-phase sintering was performed in a nitrogen atmosphere at 600° C. for 60 minutes to obtain an alloy composite. After the surface of the obtained alloy composite was grounded, Ti and Ni were deposited to a total thickness of 0.3 μm. Furthermore, a 10-μm-thick metallic layer was formed by a Ni-plating process. Subsequently, the solid-phase sintering was performed by hot-pressing under the condition that the alloy composite was held in vacuum at 450° C. under 100 MPa for 10 minutes. After deburring, the blister test was performed. Subsequently, a 3-μm-thick Ni—B plating was formed, and the void quality of the soldering was assessed.

The result is shown in Table 2.

Example 5: Assessment of Semiconductor Module Including Semiconductor Device Mounted on Heat Dissipation Substrate in Package Members made of ceramics, Kovar and other materials were silver-brazed on the heat dissipation substrate of Example 3 (coefficient of thermal expansion, 8.3 ppm/K; thermal conductivity, 555 W/m·K) in a hydrogen atmosphere at 750° C. After confirming that there was neither separation nor crack, a package was created. On this package, the metallic electrodes of a silicon device measuring 10 mm×10 mm×0.7 mm was bonded with a high-temperature AuSn solder (melting point, 280° C.) at 300° C. Using ultrasonic waves, it was confirmed that the obtained semiconductor module had a void area of 3% or lower. For this semiconductor module, a heat cycle test was conducted (from −40° C. to 125° C., 3000 times). Meanwhile, for comparison, another package was similarly created using a heat dissipation substrate (with a CuW content of 20 wt %) in the same size as aforementioned, with a coefficient of thermal expansion of 8.3 ppm/K (the same as Example 3) and a thermal conductivity of 200 W/m·K. After mounting the devices, the heat cycle test was conducted (from −40° C. to 125° C., 3000 times).

The result confirmed that separation, crack or other problems did not occur on any of the two samples.

Examples 1, 2 and 3

TABLE 1

| | Heat Dissipation Substrate Made of Metal-Diamond Composite | | | | | | | | | |
|---|---|---|---|---|---|---|---|---|---|---|
| | Composition | | | | | | Liquid-Phase Sintering | | Metallic Layer Plating | Solid-Phase Sintering |
| | Principal Metal | | Additive | | Diamond | | | | | |
| No | Ag (vol %) | Cu (vol %) | Ti (vol %) | Cr (vol %) | Dia (vol %) | Size (μm) | Equipment and Atmosphere | Temperature (° C.) | Kind | Thickness (μm) | Equipment and Atmosphere |
| 1 | 75 | | 0 | | 25 | 30 | furnace, vacuum | 1100 | none | — | none |
| 2 | 70 | | 0 | | 30 | 30 | furnace, vacuum | 1100 | none | — | none |
| 3 | 69.5 | | 0.5 | | 30 | 30 | furnace, vacuum | 1100 | none | — | none |

TABLE 1-continued

| No | | | | | | | | | | |
|---|---|---|---|---|---|---|---|---|---|---|
| 4 | 69 | | 1 | | 30 | 30 | furnace, vacuum | 1100 | none | — | none |
| 5 | 69 | | 1 | | 30 | 30 | furnace, vacuum | 1100 | Ag | 2.5 | hot-press, vacuum |
| 6 | 69 | | 1 | | 30 | 30 | furnace, vacuum | 1100 | Ag | 5 | hot-press, vacuum |
| 7 | 69 | | 1 | | 30 | 30 | furnace, vacuum | 1100 | Ag | 5 | hot-press, vacuum |
| 8 | 69 | | 1 | | 30 | 30 | furnace, vacuum | 1100 | Ag | 5 | none |
| 9 | 69 | | 1 | | 30 | 30 | furnace, vacuum | 1100 | Ag | 5 | hot-press, vacuum |
| 10 | 69 | | 2 | | 30 | 100 | furnace, vacuum | 1100 | Ag | 100 | hot-press, vacuum |
| 11 | | 38 | 2 | | 60 | 5 | furnace, hydrogen | 1200 | Cu | 50 | electrical welder, vacuum |
| 12 | | 38 | 2 | | 60 | 10 | furnace, hydrogen | 1200 | Cu | 50 | electrical welder, vacuum |
| 13 | | 38 | 2 | | 60 | 10 | furnace, hydrogen | 1200 | Cu | 50 | electrical welder, vacuum |
| 14 | | 38 | 3 | | 60 | 10 | furnace, hydrogen | 1200 | Cu | 50 | electrical welder, vacuum |
| 15 | | 35 | 5 | | 60 | 100 | furnace, hydrogen | 1200 | Cu | 50 | electrical welder, vacuum |
| 16 | | 35 | 5 | | 60 | 300 | furnace, hydrogen | 1200 | Cu | 100 | electrical welder, vacuum |
| 17 | | 35 | 5 | | 60 | 300 | furnace, hydrogen | 1200 | Cu | 200 | electrical welder, vacuum |
| 18 | | 35 | 6 | | 60 | 300 | furnace, hydrogen | 1200 | Cu | 200 | electrical welder, vacuum |
| 20 | 48 | | 2 | | 50 | 100 | furnace, vacuum | 1100 | Cu | 100 | welder, underwater |
| 21 | 48 | | 3 | | 50 | 1000 | furnace, vacuum | 1100 | Cu | 100 | welder, underwater |
| 22 | 48 | | 2 | | 50 | 1200 | furnace, vacuum | 1100 | Cu | 100 | welder, underwater |
| 23 | | 48 | 3 | | 50 | 100 | furnace, hydrogen | 1200 | Cu | 100 | welder, underwater |
| 22 | 10 | 38 | 2 | | 50 | 100 | furnace, vacuum | 1000 | Cu | 100 | welder, underwater |
| 24 | 10 | 87 | 3 | | 30 20 | 100 30 | furnace, vacuum | 1000 | Cu | 100 | welder, underwater |

| | Solid-Phase Sintering | | Properties | | | Rating | |
|---|---|---|---|---|---|---|---|
| No | Temperature (° C.) | Pressure (Mpa) | Adhesion of Metallic Layer No blister | Coefficient of Linear Expansion (ppm/K) | Thermal Conductivity (W/m · K) | Final Plating Ni—B(μm) | Solder Void Percentage (≤5% is OK) |
| 1 | — | — | — | 21 | 202 | 3 | NG |
| 2 | — | — | — | 23 | 315 | 3 | NG |
| 3 | — | — | — | 17 | 380 | 3 | NG |
| 4 | — | — | — | 15 | 418 | 3 | NG |
| 5 | 400 | 50 | OK | 15 | 435 | 3 | NG |
| 6 | 350 | 50 | OK | 15 | 428 | 3 | NG |
| 7 | 400 | 25 | OK | 15 | 427 | 3 | NG |
| 8 | — | — | NG | properties unmeasurable | | — | — |
| 9 | 400 | 50 | OK | 15 | 433 | 3 | OK |
| 10 | 400 | 100 | OK | 15 | 450 | 3 | OK |
| 11 | 600 | 300 | OK | 6.6 | 405 | 3 | OK |
| 12 | 350 | 300 | OK | 6.6 | 427 | 3 | NG |
| 13 | 600 | 25 | OK | 6.6 | 426 | 3 | NG |
| 14 | 600 | 300 | OK | 6.5 | 430 | 3 | OK |
| 15 | 600 | 300 | OK | 6.5 | 433 | 3 | OK |
| 16 | 600 | 300 | OK | 6.5 | 530 | 3 | OK |
| 17 | 600 | 500 | OK | 6.5 | 531 | 3 | OK |
| 18 | 700 | 600 | NG (jigs broken) | — | | — | — |
| 20 | 500 | 100 | OK | 8.4 | 560 | 3 | OK |
| 21 | 500 | 100 | OK | 8.4 | 829 | 3 | OK |

TABLE 1-continued

| 22 | 500 | 100 | OK | 8.4 | 830 | 3 | OK |
| 23 | 500 | 100 | OK | 7.4 | 550 | 3 | OK |
| 22 | 500 | 100 | OK | 7.7 | 500 | 3 | OK |
| 24 | 500 | 100 | OK | 7.7 | 555 | 3 | OK |

Example 4

TABLE 2

Heat Dissipation Substrate Made of Metal-Diamond Composite

| | Composition | | | | | Liquid-Phase Sintering | | Plate Grinding by Diamond Wheel Yes/No | Metallic Layer Deposition Ti + Ni (µm) | Metallic Layer Plating | | Solid-Phase Sintering Equipment and Atmosphere |
|---|---|---|---|---|---|---|---|---|---|---|---|---|
| | Principal Metal | Additive | | Diamond | | Equipment and Atmosphere | Temperature (° C.) | | | | | |
| No | Al (vol %) | Si (vol %) | Mg (vol %) | Dia (vol %) | Size (µm) | | | | | Kind | Thickness (µm) | |
| 25 | 34 | 3 | 1 | 60 | 50 | furnace, nitrogen | 600 | Yes | 0.3 | Ni | 10 | hot-press, vacuum |
| 26 | 31 | 5 | 1 | 60 | 50 | furnace, nitrogen | 600 | Yes | 0.3 | Ni | 10 | hot-press, vacuum |
| 27 | 29 | 10 | 1 | 80 | 50 | furnace, nitrogen | 600 | Yes | 0.3 | Ni | 10 | hot-press, vacuum |
| 28 | 29 | 10 | 1 | 80 | 50 | furnace, nitrogen | 600 | No | No | Ni—B | 10 | hot-press, vacuum |
| 29 | 29 | 10 | 1 | 60 | 50 | furnace, nitrogen | 600 | Yes | 0.3 | Ni—B | 10 | hot-press, vacuum |
| 30 | 24 | 15 | 1 | 60 | 50 | furnace, nitrogen | 600 | Yes | 0.3 | Ni | 10 | hot-press, vacuum |
| 31 | 21 | 18 | 1 | 60 | 50 | furnace, nitrogen | 600 | Yes | 0.3 | Ni | 10 | hot-press, vacuum |

| | Solid-Phase Sintering | | Assessment Result | | | Rating | |
|---|---|---|---|---|---|---|---|
| | | | Adhesion of Metallic Layer No blister | Properties | | | |
| No | Temperature (° C.) | Pressure (MPa) | | Coefficient of Linear Expansion (ppm/K) | Thermal Conductivity (W/m · K) | Final Plating Ni—B(µm) | Solder Void Percentage (≤5% is OK) |
| 25 | 450 | 100 | OK | 7.5 | 418 | 3 | OK |
| 26 | 450 | 100 | OK | 7.3 | 460 | 3 | OK |
| 27 | 450 | 100 | OK | 7.2 | 510 | 3 | OK |
| 28 | 450 | 100 | NG | properties unmeasurable | | | |
| 29 | 450 | 100 | OK | 7.2 | 507 | No | OK |
| 30 | 450 | 100 | OK | 7 | 500 | 3 | OK |
| 31 | 450 | 100 | OK | 7 | 415 | 3 | OK |

Comparative Example

TABLE 3

Properties and Assessment

| | | Properties | | Rating | | |
|---|---|---|---|---|---|---|
| No | Heat Dissipation Substrate Made of Conventional Composite | Coefficient of Linear Expansion (ppm/K) | Thermal Conductivity (W/m · K) | Final Plating Ni—P(µm) | Ni—B(µm) | Solder Void Percentage (≤5% is OK) |
| 32 | Ag | 19 | 420 | 0 | 3 | OK |
| 33 | Cu | 17 | 393 | 0 | 3 | OK |
| 34 | Al | 23 | 230 | 5 | 3 | OK |
| 35 | CuW | 6.5~8.3 | 180~200 | 5 | 3 | OK |
| 36 | CuMo | 7~10.5 | 160~286 | 5 | 3 | OK |
| 37 | CuMo Clad (Coated with Cu) | 8.7~12.5 | 220~317 | 5 | 3 | OK |
| 38 | AlSiC Sintered (Coaled with Pure Al Layer) | 8~15 | 150~200 | 5 | 3 | OK |

TABLE 3-continued

| | Properties and Assessment | | | | |
|---|---|---|---|---|---|
| | Properties | | Rating | | |
| Heat Dissipation Substrate No Made of Conventional Composite | Coefficient of Linear Expansion (ppm/K) | Thermal Conductivity (W/m · K) | Final Plating Ni—P(μm) | Ni—B(μm) | Solder Void Percentage (≤5% is OK) |
| 39 AlSiC Pressure-Infiltrated (Coated with Al Alloy Layer) | 6.5~9 | 220~200 | 5 | 3 | NG |

(Interpretation of Present Disclosure—1)

Thus, it is possible to satisfy the requirements of a high-performance heat dissipation substrate that is compatible with high-performance semiconductor modules which will be developed in the future.

(Interpretation of Present Disclosure—2)

The present invention is not limited to the present mode. Other modes will also be included in the present invention as long as the objective of the present invention can be achieved. The specific structure, mode and other aspects to be considered in carrying out the present invention may be changed to other structures as long as the objective of the present invention can be achieved. For example, the present invention can be applied to secure the plating quality of a metal-diamond heat dissipation substrate manufactured by other methods.

(Interpretation of Present Disclosure—3)

The presently disclosed embodiments and examples should be considered, in all aspects, as mere examples of non-restrictive nature. The subject matter is as set forth in patent claims and not the previous descriptions.

As explained in the previous embodiment, the heat dissipation substrate according to the present invention has a high degree of thermal conductivity and a coefficient of linear expansion of 6.5 ppm/K or higher and 15 ppm/K or lower. Accordingly, it can be suitably used as a heat dissipation substrate serving as a base for high-performance semiconductor modules which have been in recent years popularly used, i.e. those which have a coefficient of linear expansion of 6.5 ppm/K or higher and 15 ppm/K or lower. A package on which such high-performance semiconductor modules are mounted can be used in a memory, IC, LSI, power semiconductor, communication semiconductor, optical device, laser, LED, sensor, and other applications.

REFERENCE SIGNS LIST

1 . . . Material produced by forming a metallic layer on an alloy composite composed of metal, additive metal and diamond
2 . . . Upper electrode, which can be vertically moved
3 . . . Lower electrode
4 . . . Ceramic jig
5 . . . Power source for the welder
6 . . . Water
7 . . . Diamond
8 . . . Metallic layer
9 . . . Magnified photograph of a section of a heat dissipation substrate

The invention claimed is:

1. A method for producing a heat dissipation substrate, the method comprising:
   performing a plating process on a surface of an alloy composite body mainly composed of a principal metal, an additional metal which is different from the principal metal and is at least one substance selected from a group consisting of Ti, Cr, Co, Mn, Ni, Fe, B, Y, Mg and Zn, and diamond, the diamond being provided as a powder of diamond, to form a metallic layer composed of Cu, the metallic layer being formed on a surface of the alloy composite body; and
   mending a defect in the metallic layer by heating and pressurizing the alloy composite body coated with the metallic layer, at a temperature which is equal to or lower than a melting point of the metallic layer and equal to or lower than a melting point of the alloy composite body,
   wherein a coefficient of linear expansion of the heat dissipation substrate is in a range of 6.5 ppm/K or higher and 15 ppm/K or lower,
   a degree of thermal conductivity of the heat dissipation substrate is 420 W/m·K or higher,
   a carbide of the additional metal is formed on a surface of the powder of diamond.

2. The method for producing a heat dissipation substrate according to claim 1, wherein a Ni-based plating process is performed after the heating and pressurizing process is performed.

3. The method for producing a heat dissipation substrate according to claim 1, wherein:
   the metallic layer has a thickness in a range of 5 μm or larger and 200 μm or smaller.

4. The method for producing a heat dissipation substrate according to claim 1, wherein the following processes are performed before the alloy layer is formed:
   at least one of grinding and polishing the alloy composite body; and
   depositing at least one substance selected from a group consisting of Ti, Cr, Au, Pt and alloys of these metals, on at least one of the ground and polished surface of the alloy composite body.

5. The method for producing a heat dissipation substrate according to claim 1, wherein the alloy composite body is created by compacting a mixed powder of the principal metal, the additional metal which is different from the principal metal, and diamond, and performing a liquid-phase sintering process on the mold-compacted mixed powder.

6. The method for producing a heat dissipation substrate according to claim 5, wherein:
   95% or more of the diamond powder is a diamond powder having a particle size in a range of 10 μm or larger and 1000 μm or smaller;
   the principal metal is at least one substance selected from a group consisting of Ag, Cu, Al and alloys of these metals; and
   an amount of addition of the additional metal is equal to or higher than 1 vol % and equal to or lower than 15 vol % of an entire amount of the alloy composite body.

7. The method for producing a heat dissipation substrate according to claim 5, wherein:
- 95% or more of the diamond powder is a diamond powder having a particle size in a range of 10 μm or larger and 1000 μm or smaller;
- the principal metal is at least one substance selected from a group consisting of Ag, Cu and alloys of these metals; and
- the additional metal is at least one substance selected from a group consisting of Ti, Cr, Co, Mn, Ni, Fe and B, with an amount of addition being equal to or higher than 1 vol % and equal to or lower than 5 vol % of an entire amount of the alloy composite body.

8. The method for producing a heat dissipation substrate according to claim 5, wherein:
- 95% or more of the diamond powder is a diamond powder having a particle size in range of 10 μm or larger and 1000 μm or smaller;
- the principal metal is at least one substance selected from a group consisting of Al and Al alloy; and
- the additional metal further includes Si, with an amount of addition being equal to or higher than 5 vol % and equal to or lower than 15 vol % of an entire amount of the alloy composite body.

9. The method for producing a heat dissipation substrate according to claim 8, wherein 1.0 vol % of Mg is further added.

10. The method for producing a heat dissipation substrate according to claim 5, wherein the heating and pressuring process is performed in a vacuum atmosphere, low-pressure atmosphere, non-oxidizing atmosphere, reducing atmosphere, inert-gas atmosphere, fire-resistant-liquid atmosphere, or non-combustible-liquid atmosphere, at a temperature equal to or lower than a melting point of the principal metal and a melting point of an alloy of the principal metal and the additive metal, and at a pressure in a range of 50 MPa or higher and 500 MPa or lower.

11. The method for producing a heat dissipation substrate according to claim 5, wherein the heating and pressuring process is performed underwater by performing an electrical sintering process at a temperature equal to or lower than a melting point of the principal metal and a melting point of an alloy of the principal metal and the additive metal, and at a pressure in a range of 50 MPa or higher and 500 MPa or lower.

12. A heat dissipation substrate, comprising:
- an alloy composite body mainly composed of a principal metal, an additional metal which is different from the principal metal and is at least one substance selected from a group consisting of Ti, Cr, Co, Mn, Ni, Fe, B, Y, Mg and Zn, and diamond, the diamond being provided as a powder of diamond; and
- a metallic layer composed of Cu, the metallic layer being formed on a surface of the alloy composite body,
- wherein a coefficient of linear expansion of the heat dissipation substrate is in a range of 6.5 ppm/K or higher and 15 ppm/K or lower,
- a degree of thermal conductivity of the heat dissipation substrate is 420 W/m·K or higher,
- a percentage of defects on the surface of the metallic layer is 5% or lower, and
- a carbide of the additional metal is formed on a surface of the powder of diamond.

13. The heat dissipation substrate according to claim 12, wherein the metallic layer has a thickness of 2 μm or larger.

14. The heat dissipation substrate according to claim 12, wherein:
- the principal metal is at least one substance selected from a group consisting of Ag, Cu, Al and alloys of these metals; and
- an amount of addition of the additional metal is equal to or higher than 1 vol % and equal to or lower than 15 vol % of an entire amount of the alloy composite body.

15. The heat dissipation substrate according to claim 12, wherein:
- the principal metal is at least one substance selected from a group consisting of Ag, Cu and alloys of these metals; and
- the additional metal is at least one substance selected from a group consisting of Ti, Cr, Co, Mn, Ni, Fe and B, with an amount of addition being equal to or higher than 1 vol % and equal to or lower than 5 vol % of an entire amount of the alloy composite body.

16. The heat dissipation substrate according to claim 12, wherein:
- the principal metal is at least one substance selected from a group consisting of Al and Al alloy; and
- the additional metal further includes Si, with an amount of addition being equal to or higher than 5 vol % and equal to or lower than 15 vol % of an entire amount of the alloy composite body.

17. The heat dissipation substrate according to claim 16, wherein 1.0 vol % of Mg is further added.

18. The heat dissipation substrate according to claim 12, wherein a layer made of at least one substance selected from a group consisting of Ti, Cr, Au and Pt is formed between the alloy composite body and the metallic layer.

19. A package for a semiconductor, comprising the heat dissipation substrate according to claim 12.

20. A module for a semiconductor, comprising the heat dissipation substrate according to claim 12.

21. The module for a semiconductor according to claim 20, wherein a Ni-based plating and a solder joint are formed on a surface of the metallic layer, with the solder joint having a void percentage of 5% or lower.

* * * * *